(12) United States Patent
Humphreys et al.

(10) Patent No.: US 6,710,664 B2
(45) Date of Patent: Mar. 23, 2004

(54) COARSE TUNING FOR FRACTIONAL-N SYNTHESIZERS

(75) Inventors: Scott Robert Humphreys, Greensboro, NC (US); Ralph Christopher Nieri, Summerfield, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 10 days.

(21) Appl. No.: 10/127,289

(22) Filed: Apr. 22, 2002

(65) Prior Publication Data

US 2003/0197564 A1 Oct. 23, 2003

(51) Int. Cl.[7] .............................................. H03L 7/00
(52) U.S. Cl. ............................. 331/11; 331/17; 331/25
(58) Field of Search ...................... 331/1 A, 17, 183, 331/11, 16, 25, 36 C, 175

(56) References Cited

U.S. PATENT DOCUMENTS

| | | | | |
|---|---|---|---|---|
| 3,538,450 A | * | 11/1970 | Andrea et al. ................. | 331/10 |
| 4,875,046 A | * | 10/1989 | Lewyn ........................ | 331/148 |
| 5,117,206 A | * | 5/1992 | Imamura ..................... | 331/158 |
| 5,235,335 A | * | 8/1993 | Hester et al. ................ | 341/172 |
| 5,493,715 A | * | 2/1996 | Humphreys et al. ......... | 455/264 |
| 5,635,875 A | * | 6/1997 | Kusakabe .................... | 331/1 A |
| 5,973,633 A | * | 10/1999 | Hester ......................... | 341/172 |

FOREIGN PATENT DOCUMENTS

JP      406077820    * 3/1994

OTHER PUBLICATIONS

Vogelmann et al. "20 mW SiGe–MMIC–VCO at 5 GHz with Integrated 4:1 Divider for Use in a PLL" Silcon Monolithic Integrated Circuits in RF Systems 2001 Sep. 12–14, 2001 pp 222–225.*

* cited by examiner

Primary Examiner—Michael B Shingleton
(74) Attorney, Agent, or Firm—Withrow & Terranova, PLLC

(57) ABSTRACT

The present invention provides an efficient coarse tuning process for fractional-N synthesizers. In general, a divided reference signal and a divided controllable oscillator (CO) signal from the phase lock loop (PLL) of a synthesizer are each further divided by a common factor M to provide an average reference signal and an average CO signal, respectively. Averaging the divided CO signal reduces jitter caused by fractional-N division of the CO signal. The frequencies of the average CO signal and the average reference signal are compared and the result is used to select an appropriate tuning curve for operating the CO.

40 Claims, 3 Drawing Sheets

# COARSE TUNING FOR FRACTIONAL-N SYNTHESIZERS

FIELD OF THE INVENTION

The present invention relates in general to fractional-N synthesizers, and, in particular, to a technique to provide coarse tuning of an oscillator in a fractional-N synthesizer.

BACKGROUND OF THE INVENTION

Frequency synthesizers are used in many systems, including microprocessors and radio frequency (RF) communication systems. Frequency synthesizers of the phase locked loop (PLL) type contain controlled oscillators (CO) that are typically current controlled oscillators (ICO) or voltage controlled oscillators (VCO). The output of the CO is often used as an injection signal for an RF mixer or in a microprocessor clock system. The frequency synthesizer controls the CO such that its frequency or period is approximately equal to that of a stable frequency reference multiplied by a predetermined ratio. In many applications, there is a need to compensate for process and environmental variations that affect synthesizer performance. The prior art contains many systems that compensate for variations in the CO's frequency tuning range or center frequency by performing a coarse tuning of the tunable elements in the CO. These systems have been developed for integer-N synthesizers where the divided CO signal used for feedback to the phase detector has a steady period when the CO's output frequency is not changing.

The use of fractional-N synthesizers provides reduced lock times for the synthesizer's phase lock loop (PLL) and improves noise performance, but introduces significant jitter on the divided CO signal. Even with a constant CO output frequency, the divider modulus is constantly changing to provide a desired average fractional modulus over a period of time. The jitter on the divided CO signal significantly reduces the accuracy of existing techniques for calibrating and tuning the CO. Accordingly, there is a need for a technique to reduce the impact of jitter on the divided CO signal and provide accurate calibration or coarse tuning of a CO in a fractional-N synthesizer in a cost-effective and efficient manner.

SUMMARY OF THE INVENTION

The present invention provides an efficient coarse tuning process for fractional-N synthesizers. In general, a reference signal and a divided controllable oscillator (CO) signal from the phase lock loop (PLL) of a synthesizer are each further divided by a common factor M to provide an average reference signal and an average CO signal, respectively. Frequency division by a factor M is an efficient method of adding the durations of M successive periods of the divided CO signal. The period of the average CO signal is approximately equal to M times the average period of the divided CO signal. When the synthesizer is in lock, the average period of the divided CO signal is approximately equal to the period of the reference signal. Hence, the period of the average CO signal is approximately equal to the period of the average reference signal. Averaging the divided CO signal reduces jitter caused by fractional-N division of the CO signal. The frequencies of the average CO signal and the average reference signal are compared and the result is used to select an appropriate tuning curve for operating the CO.

In one embodiment, the capacitance value of a switched capacitance in the resonant tank or analogous frequency control circuit of the CO is selected based on comparing the frequencies of the average CO and average reference signals. These frequencies may be compared by measuring the periods for the respective signals. Preferably, the process repeats for each tuning curve by progressively incrementing or decrementing the capacitance value of the switched capacitance until an acceptable tuning curve is selected.

Accordingly, a first divider circuit divides the divided reference signal by a factor of M to create an average reference signal. A second divider circuit divides the divided CO signal by a factor of M to create an average CO signal. Tuning logic processes the average reference signal and average CO signal to provide a CO control signal, which controls calibration of the CO. In the preferred embodiment, the tuning logic is a state machine configured to compare the periods of the average CO signal and average reference signal and provide a pulse for the CO control signal to control a coarse tune counter. The output of the coarse tune counter provides a CO tank capacitance-select signal to select a capacitance value of the CO's resonant tank circuit.

During coarse tuning, the CO fine tuning signal is forced to a desired initialization value under the control of the tuning logic. The tuning logic will typically provide a loop filter control signal to cause a switch to apply the initialization value to the fine tuning signal of the CO. The capacitance of the tank capacitance circuit is incremented or decremented throughout a desired operating range until the average CO signal and average reference signal are substantially the same. At this point, the initialization value is removed from the fine tuning signal and the PLL is allowed to lock in traditional fashion.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
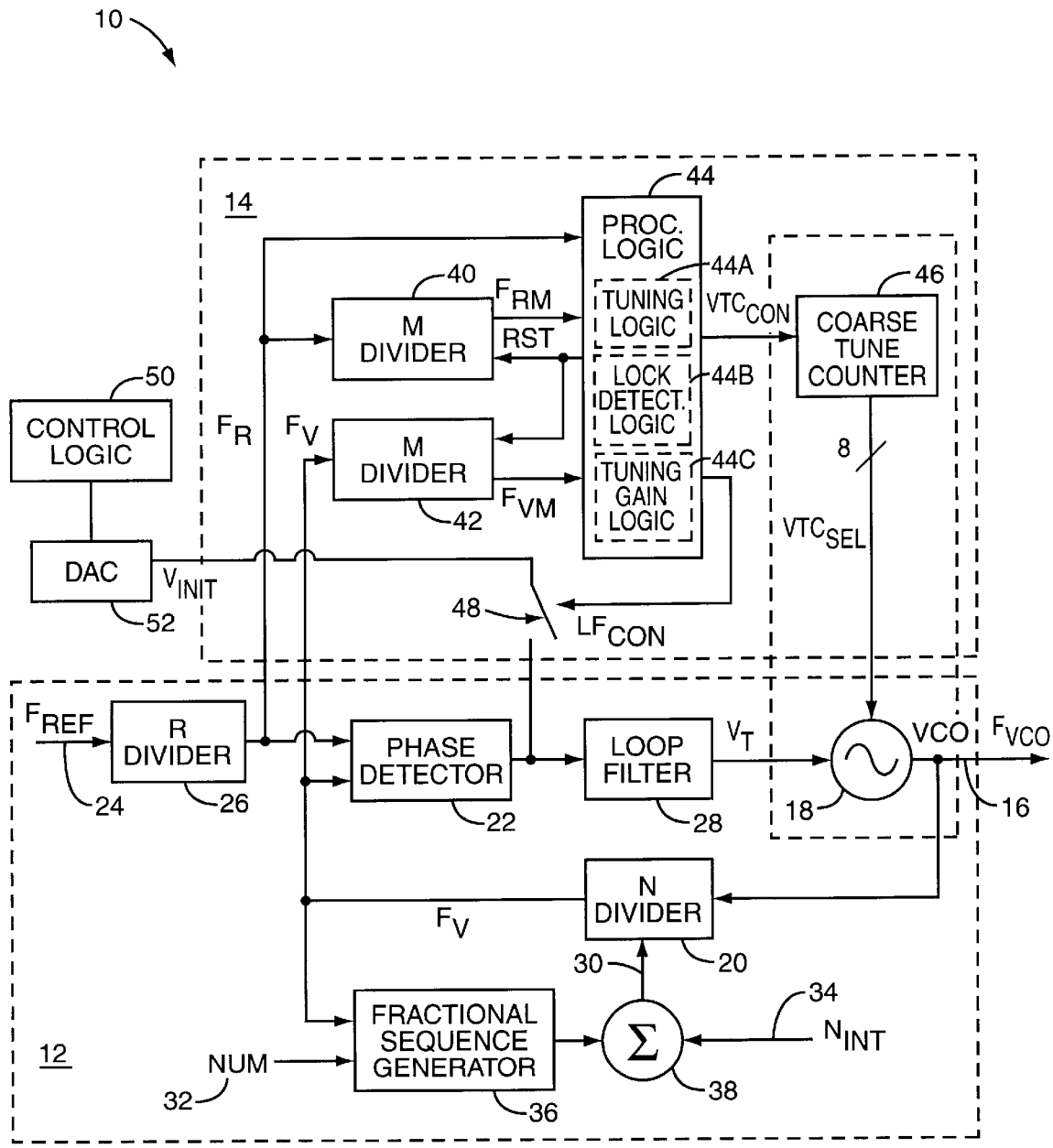
FIG. 1 is a block representation of a fractional-N synthesizer according to one embodiment of the present invention.

With reference to FIG. 1, a fractional-N frequency synthesizer 10 is illustrated according to one embodiment of the present invention. The synthesizer 10 includes a fractional-N phase lock loop (PLL) 12 and coarse tuning circuitry 14. The PLL 12 generates a desired frequency for the output signal, $F_{VCO}$, 16, of a voltage controlled oscillator (VCO) 18. In traditional fashion, the output signal $F_{VCO}$ 16 is also provided to divider circuitry 20 to divide the output signal $F_{VCO}$ by a factor N to produce a divided VCO signal $F_V$, which is fed to one of two inputs of a phase detector 22.

A reference signal, $F_{REF}$, 24, is divided by a factor R by divider circuitry 26 to produce a divided reference signal, $F_R$, which is provided to the other input of the phase detector 22. The N and R factors are selected so that the frequencies of the divided reference signal, $F_R$, and the divided VCO signal, $F_V$ are equal when the desired output signal, $F_{VCO}$, 16, is at a desired frequency. The phase detector 22 compares the relative phases of the divided reference signal, $F_R$, and the divided VCO signal, $F_V$, and provides an output relative to the difference in phase to control the VCO 18. The output of the phase detector is preferably provided by a charge pump and filtered by a loop filter 28 to provide a stable voltage for a VCO fine tuning signal, $V_T$, to adjust the desired output frequency $F_{VCO}$ of the VCO 18 based on the difference in phase of the divided reference signal, $F_R$, and the divided VCO signal, $F_V$.

For the fractional-N frequency synthesizer 10, the dividing factor N is generated by varying the divide value 30 of the divider circuitry 20 in order to provide, on average, a fractional (non-integer) value . To create the divide value 30, an integer value, $N_{INT}$, 34, is combined with a fractional component. Traditionally, a number, NUM 32, representing a numerator of the fractional component, is processed by a fractional sequence generator 36 to create a sequence of integer values, which have an average value equal to the desired fraction. In one embodiment, the fractional sequence generator 36 employs a third order MASH style delta-sigma modulator.

Each value of the sequence of integer values is summed with the integer value $N_{INT}$ 34 using summing circuitry 38 to create an integer sequence for the divide value 30. The integer sequence will have an average equal to the desired divide value N. Accordingly, the divider circuitry 20 is loaded with a divide value 30 that may vary from one divide cycle to the next in order to achieve the desired fractional division. The result is significant jitter on the divided VCO signal, $F_V$, which reduces the accuracy of traditional techniques for calibrating the VCO 18.

The coarse tuning circuitry 14 of the present invention effectively calibrates the frequency range of the VCO 18 for improved fractional-N performance, such as reduced lock time, or improved robustness over environmental variations. In general, a divider circuit 40 divides the divided reference signal, $F_R$, by a factor of M to create an average reference signal, $F_{RM}$. Divider circuit 42 divides the divided VCO signal, $F_V$, by a factor of M to create an average VCO signal, $F_{VM}$. Dividing the divided reference frequency, $F_R$, and the divided VCO frequency, $F_V$, by the factor M effectively averages the divided reference frequency, $F_R$, and the divided VCO frequency, $F_V$, over M periods and significantly reduces the jitter appearing on the divided VCO frequency, $F_V$. In one embodiment, where the fractional sequence generator 36 employs a third order MASH style delta-sigma modulator, sufficient smoothing of the divided VCO frequency, $F_V$, is provided when the divider circuits 40 and 42 provide a modulus of 64 (M=64).

Tuning logic 44 processes the average reference signal $F_{RM}$ and average VCO signal $F_{VM}$ to provide a VCO control signal $VTC_{CON}$, which controls calibration of the VCO 18. In the preferred embodiment, the tuning logic 44 is a state machine configured to compare the periods of the average VCO signal $F_{VM}$ and average reference signal $F_{RM}$ and provide a pulse for the control signal $VTC_{CON}$ to control a coarse tune counter 46. The output of the coarse tune counter 46 provides select signal $VTC_{SEL}$ to select a capacitance value of the VCO's resonant circuit. Alternatively, the tuning logic 44 may generate the VCO select signal $VTC_{SEL}$ directly, for example, as the output of a state machine.

During coarse tuning, the VCO fine tuning signal $V_T$ is forced to a desired initialization value (voltage or current) under the control of the tuning logic 44. Using a switch 48, the initialization value, $V_{INIT}$, is coupled to the output of the loop filter 28 to force the VCO fine tuning signal $V_T$ to the initialization value, $V_{INIT}$. The switch 48 may take many forms, including a transistor biased to provide a switching function. The initialization value, $V_{INIT}$, may be provided using a variety of techniques. In one embodiment, control logic 50 provides a digital value to a digital-to-analog converter (DAC) 52, which provides a corresponding analog voltage for the initialization value, $V_{INIT}$. The tuning logic 44 will typically provide a loop filter control signal, $LF_{CON}$, to cause switch 48 to apply the initialization voltage, $V_{INIT}$, to the input of the loop filter 28. Detail on coarse tuning is provided later in the specification.

Figure 2A:
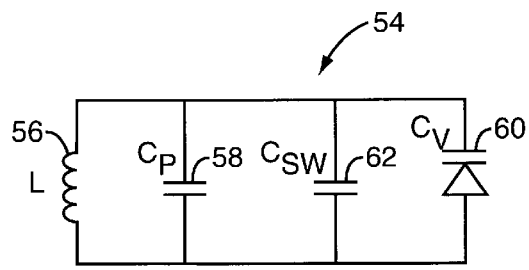
FIG. 2A is a schematic representation of a resonant tank circuit of a voltage controlled oscillator according to one embodiment of the present invention.

With reference to FIG. 2A, the VCO 18 has a tank circuit 54 including parallel inductance 56 (L), fixed or parasitic capacitance 58 ($C_P$), variable capacitance 60 ($C_V$) and switched capacitance 62 ($C_{SW}$). The resonant frequency of the tank circuits is defined by:

$$f = \frac{1}{2\pi\sqrt{L(C_p + C_{sw} + C_v)}}.$$

The variable capacitance 60 may be a varactor or other continuously variable capacitance. The variable capacitance 60 is typically used for fine tuning under the control of the fine tuning signal $V_T$ provided by the PLL 12.

Figure 2B:
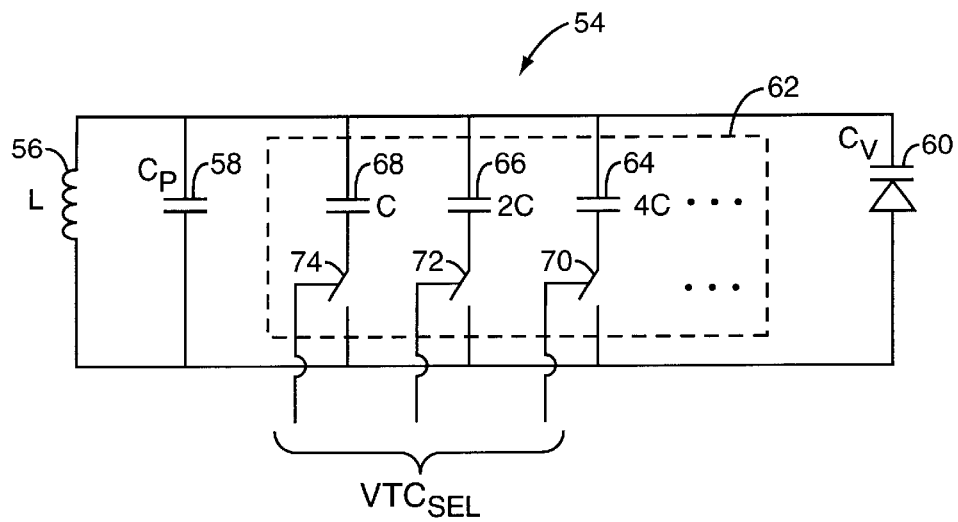
FIG. 2B is an expanded schematic representation of the resonant tank circuit of FIG. 2A.

As shown in FIG. 2B, the switched capacitance 62 is preferably a network of capacitors 64, 66, 68, which can be selectively switched into or out of the VCO tank circuit 54 via switches 70, 72, 74, respectively, for coarse tuning. The switches 70, 72, 74 can take many forms, including transistors biased to operate as switches. The capacitors 64, 66, 68 are preferably binary weighted and switched into the VCO tank circuit 54 under the control of the VCO tank capacitance select signal $VTC_{SEL}$ from the coarse tune counter 46. The VCO tank capacitance select signal $VTC_{SEL}$ is a three bit digital signal, where the bits correspond to the respective capacitance values C, 2C, 4C for the capacitors 64, 66, 68, respectively. Accordingly, VTC signal values 000 (binary) through 111 will correlate to capacitance values 0 through 7C for the switched capacitance 62 of the VCO tank circuit 54. Alternatively, the capacitors may be unit weighted, for example to allow an interdigitated layout for better matching, as is well known in the art. In this case, a translation circuit may be needed between the output of the coarse tune counter 46 and the VCO 18. Those skilled in the art will recognize that a variety of simpler techniques may be used to achieve this same translation. For example, in place of the coarse tune counter 46, a shift register constructed to start with its outputs at logical zero (or one) and shift in a series of logical ones (or zeros) in response to each pulse on the control signal $VTC_{CON}$ may be used.

Figure 3:
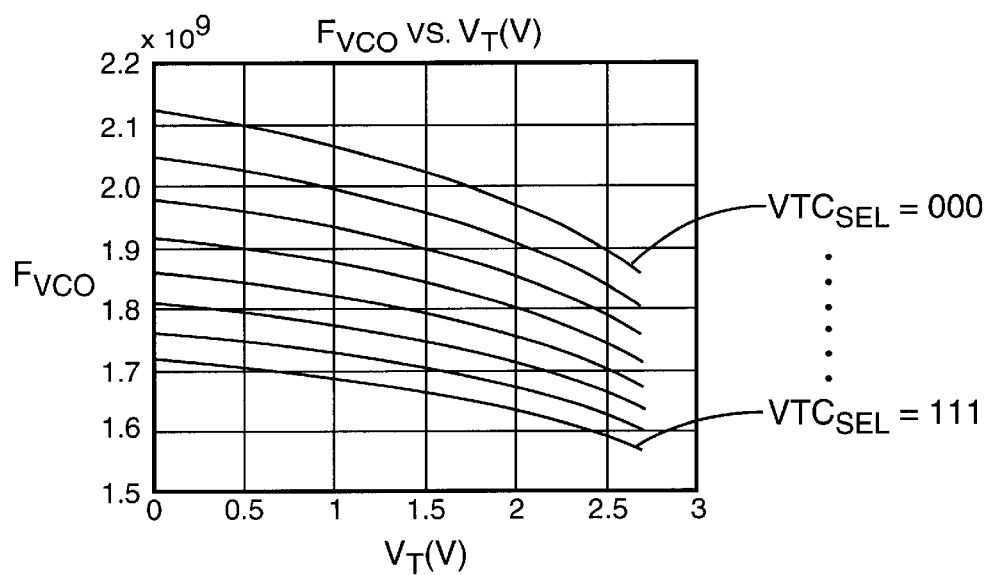
FIG. 3 is a graphic representation of the tuning curves for an exemplary voltage controlled oscillator.

The operating characteristics for an exemplary VCO 18 having the above-configured VCO tank circuit 54 are shown in FIG. 3. Since the switched capacitance 62 can be configured to have one of eight capacitance values, the VCO 18 will have eight tuning curves corresponding to the respective capacitance values. The bottom tuning curve corresponds to having all three capacitors 64, 66, 68 switched into the network when the select signal $VTC_{SEL}$ is 111. The top tuning curve corresponds to having all three capacitors 64, 66, 68 switched out of the network when the select signal $VTC_{SEL}$ is 000. Depending on the fine tuning signal voltage, $V_T$, there are multiple tuning curves capable of providing a selected frequency. For best noise performance and more consistent tuning gain for the VCO 18, the voltage of the fine tuning signal, $V_T$, should be kept within an acceptable range. Typically, the Q of the varactor 60 tends to fall off at higher capacitance and lower frequency values. For this example, assume the preferred operating range for the VCO 18 corresponds to a fine tuning signal voltage $V_T$ between 0.4 and 1.6 volts.

Figure 4:
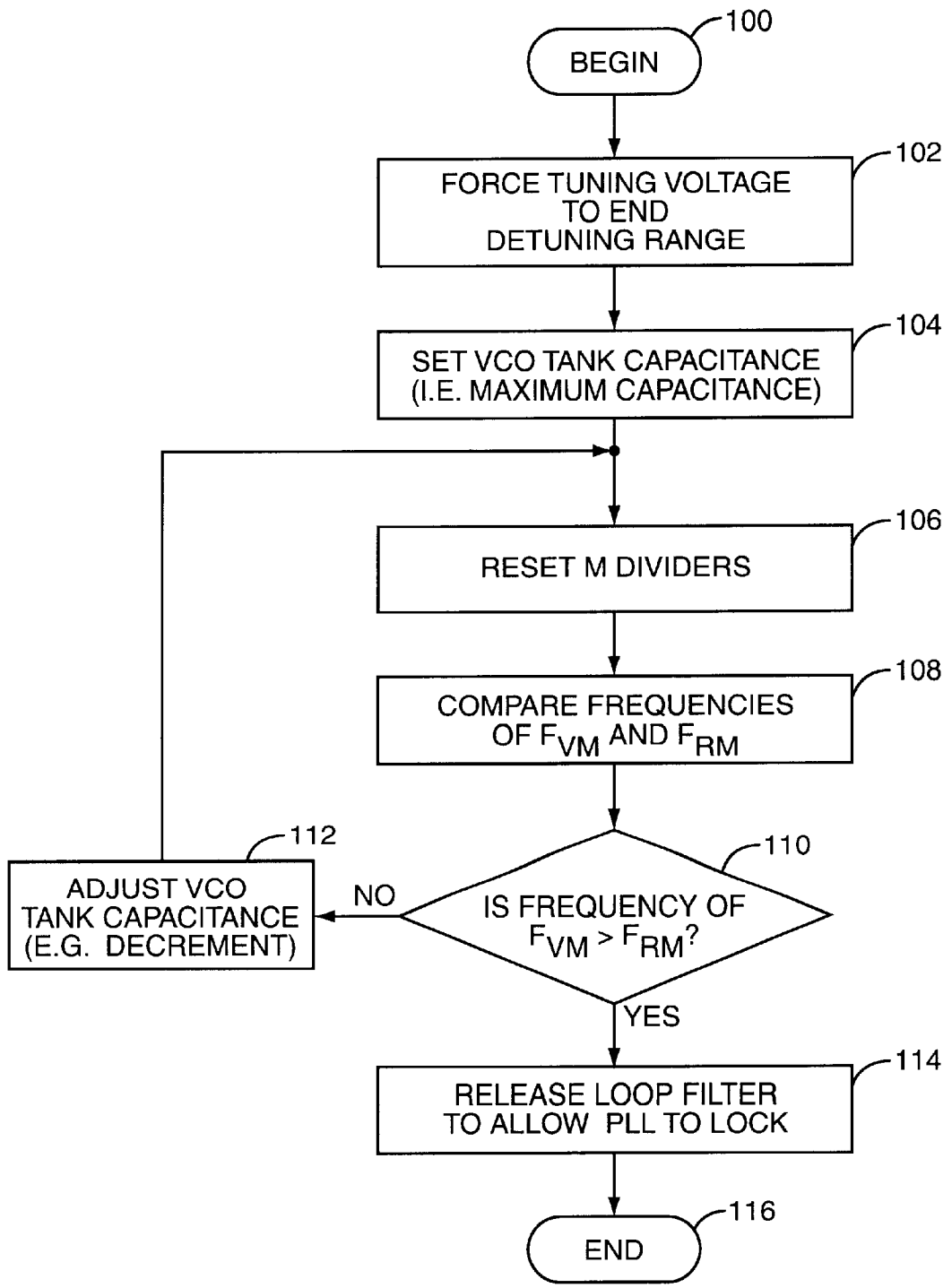
FIG. 4 is a flow diagram outlining a coarse tuning process according to one embodiment of the present invention.

In operation, a coarse tuning process is carried out each time the PLL 12 is enabled. The tuning process selects an appropriate capacitance setting for the switched capacitance 62 within a period of time sufficiently short that it does not significantly impact the lock time for the PLL 12. In general, the process operates by comparing the periods of the average VCO signal $F_{VM}$ and the average reference signal $F_{RM}$ and selecting an appropriate capacitance for the switched capacitance 62 to set the frequency of the VCO's output signal $F_{VCO}$ 16. Preferably, the process repeats for each tuning curve by progressively incrementing or decrementing different capacitance 62 values until an acceptable tuning curve is selected. Further details for the tuning process according to one embodiment of the present invention are provided in association with the flow diagram of FIG. 4.

The coarse tuning process begins (step 100) by forcing the tuning voltage of the VCO fine tuning signal $V_T$ to one end of the acceptable range (step 102). For the illustrated example, the VCO fine tuning signal $V_T$ is forced to 0.4 volts. Assume the control logic 50 sends a digital value to the DAC 52 to set the initialization voltage, $V_{INIT}$, to 0.4 volts. The tuning logic 44 will then activate the loop filter control signal $LF_{CON}$ to close switch 48 and apply the initialization voltage, $V_{INIT}$, to the input of the loop filter 28. Applying a constant voltage to the loop filter 28, which is typically a low pass filter, forces the VCO fine tuning signal $V_T$ to 0.4 volts.

Next, the capacitance of the tank circuit 54 for the VCO 18 is set to select a tuning curve corresponding to a minimum frequency range (step 104). Accordingly, the coarse tune counter 46 generates a select signal $VTC_{SEL}$ to switch each of the capacitors 64, 66, and 68 into the switched capacitance 62 to set the VCO 18 to operate at the minimum frequency range. In this example, the select signal $VTC_{SEL}$ is initialized to 111. In alternative embodiments, the VCO 18 may be initialized for the maximum frequency range.

At the start of the coarse tuning operation, the switched capacitance 62 is initialized and the VCO fine tuning signal $V_T$ is forced to 0.4 volts. The tuning logic 44 then compares the frequencies for the average reference signal $F_{RM}$ and the average VCO signal $F_{VM}$ (step 108).

The frequencies of these signals may be determined in a variety of ways. In the preferred embodiment, the divider 40 receives the divided reference signal $F_R$ and provides an output pulse every M cycles to generate the average reference signal $F_{RM}$. Similarly, the divider 42 receives the divided VCO signal $F_V$ and provides an output pulse every M cycles to generate the average VCO signal $F_{VM}$. The tuning logic 44 receives both the average reference signal $F_{RM}$ and the average VCO signal $F_{VM}$. Preferably, the tuning logic 44 resets each of the divider circuits 40 and 42 with the $R_{ST}$ signal (step 106), and then senses whether the first output pulse of the average VCO signal $F_{VM}$ occurs before the first output pulse of the average reference signal $F_{RM}$, indicating that the frequency of the average VCO signal $F_{VM}$ is higher than that of the average reference signal $F_{RM}$. Because the frequency of the average reference signal $F_{RM}$ and the frequency of average VCO signal $F_{VM}$ are simply equal to the frequency of the divided reference signal $F_R$ and the divided VCO signal $F_V$, respectively, divided by M, this condition also indicates that the frequency of the VCO is higher than the desired operating frequency.

With the voltage of the tuning signal at 0.4 volts, the frequency of the output signal $F_{VCO}$ is higher than that desired when the appropriate tuning curve is selected. By comparing the respective periods, if the frequency of the average VCO signal $F_{VM}$ is determined to be less than that of the average reference $F_{RM}$ signal (i.e. the period for $F_{VM}$ is greater than $F_{RM}$ (step 110), the tuning logic 44 preferably provides a control signal $VTC_{CON}$ to decrement the coarse tune counter 46. Decrementing the coarse tune counter 46 results in a VCO select signal $VTC_{SEL}$ decrementing the capacitance value of the switched capacitance 62 to select the next higher tuning curve, which corresponds to the next higher frequency range (step 112).

The periods for the average VCO signal $F_{VM}$ and the average reference signal $F_{RM}$ are again compared, and the switched capacitance 62 is decremented until the frequency of the average VCO signal $F_{VM}$ is greater than the frequency of the average reference signal $F_{RM}$ (step 110). Once the frequency of the average VCO signal $F_{VM}$ is greater than the frequency of the average reference signal $F_{RM}$, the tuning logic 44 releases the initialization voltage $V_{INIT}$ from the input of the loop filter 28 via the $LP_{CON}$ signal to allow the PLL 12 to lock (step 114) and the process ends (step 116). The tuning logic 44 will maintain the switched capacitance 62 at the appropriate capacitance via the VCO select signal $VTC_{SEL}$ to ensure that the VCO 18 operates at the appropriate tuning curve.

Alternatively, the VCO 18 may be initialized for the maximum frequency range wherein the select signal $VTC_{SEL}$ is 000. During coarse tuning, the VCO fine tuning signal $V_T$ is forced to 1.6 volts and the switched capacitance 62 is incremented until the frequency of the average VCO signal $F_{VM}$ is less than the frequency of the average reference signal $F_{RM}$.

The maximum duration of the coarse tuning process is approximately the period of the average reference frequency, $F_{RM}$ ($M*R/F_{REF}$), times the number of capacitance settings for the switched capacitance 62 of the VCO tank circuit 54. For a 26 MHz reference frequency $F_{REF}$, an R value of 1, an M value of 64, and eight capacitance settings, the coarse tuning operation would take at most 20 microseconds before the phase locking in the PLL 12 can begin. Accordingly, the impact of coarse tuning on locking time of the PLL 12 is minimal. Alternatively, a binary search algorithm may be employed, in which only one frequency comparison is required for each bit of the VCO control signal $VTC_{CON}$. In this example, only three comparisons would be needed instead of eight, further reducing the duration of the coarse tuning operation.

Preferably, the invention is implemented in a manner minimizing the number of interconnections between the coarse tuning circuitry 14 and the PLL 12, especially in embodiments where the two circuits are on separate packages or semiconductor die. For example, the coarse tune counter 46 and VCO 18 may be placed on a common die, and the coarse tune counter 46 will only require one input to receive the VCO control signal $VTC_{CON}$ to control the value of the switched capacitance 62 of the VCO tank circuit 54. This arrangement reduces the number of pins required on the associated semiconductor packages, or the number of bond pads on the associated die, reducing cost and area.

It will be recognized that the above discussion applies equally well to other types of oscillators that may be used with fractional-N frequency synthesizers. For example, ring oscillators can be constructed with coarse and fine tuning control signals provided by switched capacitive loads or switched transistor amplifier stages, and supply voltage or current tuning, respectively. Accordingly, elements, such as gain stages or impedance devices, may be selectively switched into or out of the current or voltage controlled oscillator circuitry to select a tuning curve. Further, the counters described herein may be implemented using registers to hold value, or state machines. As such, a counter is deemed to cover and include these configurations.

Additional detail pertaining to ring oscillators is found in, "An all-digital phase-locked loop with 50-cycle lock time suitable for high-performance microprocessors," by J. Dunning et al., IEEE Journal of Solid-State Circuits, Volume 30, Issue 4, April 1995, pages 412–422.

Those skilled in the art will recognize improvements and modifications to the preferred embodiments of the present invention. All such improvements and modifications are considered within the scope of the concepts disclosed herein and the claims that follow.

What is claimed is:

1. A circuit for coarse tuning a fractional-N synthesizer comprising:
    a) a first divider adapted to further divide a divided reference signal derived from the reference frequency of a phase lock loop (PLL) by a factor M to provide an average reference signal;
    b) a second divider adapted to further divide a divided controlled oscillator (CO) signal by the factor M to provide an average CO signal wherein the divided reference signal and the divided CO signal are approximately equal when a CO is operating at a desired frequency and the divided CO signal is derived from fractional-N division of the output of the CO for the PLL; and
    c) tuning logic adapted to compare a frequency of the average reference signal and the frequency of the average CO signal and provide a CO control signal to select a tuning curve for the CO based thereon to effect coarse tuning of the CO.

2. The circuit of claim 1 wherein the CO comprises a circuit having a selectable capacitance with a plurality of settings corresponding to a plurality of tuning curves and the tuning logic is further adapted to provide the CO control signal to iteratively select the plurality of tuning curves until the frequency of the average CO signal is within a desired proximity of the frequency of the average reference signal.

3. The circuit of claim 1 wherein the CO comprises a circuit having a plurality of selectable elements corresponding to a plurality of tuning curves and the tuning logic is further adapted to provide the CO control signal to iteratively select the plurality of tuning curves until the frequency of the average CO signal is within a desired proximity of the frequency of the average reference signal.

4. The circuit of claim 2 further comprising a coarse tune counter adapted to receive the CO control signal and generate a select signal to provide to the circuit of the CO to control the selectable capacitance.

5. The circuit of claim 4 further comprising the CO.

6. The circuit of claim 5 wherein the CO and the coarse tune counter are implemented in one of the group consisting of an integrated circuit and a semiconductor die.

7. The circuit of claim 1 wherein the CO control signal is a pulse configured to effect either incrementing or decrementing a capacitance of a switched capacitance having a plurality of selectable capacitance values.

8. The circuit of claim 7 further comprising a coarse tune counter adapted to receive the pulse representing the CO control signal and generate a select signal to provide to the circuit of the CO to select one of the plurality of selectable capacitance values.

9. The circuit of claim 1 further comprising a switch for coupling a fixed initialization signal to a fine tuning signal for the CO to override feedback from a phase detector of the PLL during coarse tuning and bias the CO to operate at a predefined control setting.

10. The circuit of claim 9 wherein the tuning logic is adapted to control the switch.

11. The circuit of claim 1 wherein the CO comprises a circuit having a selectable capacitance with a plurality of settings corresponding to a plurality of tuning curves and the tuning logic is further adapted to provide the CO control signal to iteratively decrement the selectable capacitance to select another of the plurality of tuning curves when the average CO signal has a frequency less than that of the average reference signal.

12. The circuit of claim 11 wherein the circuit of the CO is initialized to one of the tuning curves associated with a lowest acceptable operating frequency range.

13. The circuit of claim 1 wherein the CO comprises a circuit having a selectable capacitance with a plurality of settings corresponding to a plurality of tuning curves and the tuning logic is further adapted to provide the CO control signal to iteratively increment the selectable capacitance to select another of the plurality of tuning curves when the average CO signal has a frequency greater than that of the average reference signal.

14. The circuit of claim 13 wherein the circuit of the CO is initialized to one of the tuning curves associated with a highest acceptable operating frequency range.

15. The circuit of claim 1 wherein the tuning logic is adapted to compare the frequency of the average reference signal and the frequency of the average CO signal by comparing the period of the average reference frequency with the period of the average CO frequency.

16. A method for coarse tuning a fractional-N synthesizer comprising:
    a) dividing a divided reference signal derived from a reference frequency of a phase lock loop (PLL) by a factor M to provide an average reference signal;
    b) dividing a divided controlled oscillator (CO) signal by the factor M to provide an average CO signal wherein the divided reference signal and the divided CO signal are approximately equal when a CO is operating at a desired frequency and the divided CO signal is derived from fractional-N division of the output of the CO for the PLL;
    c) comparing a frequency of the average reference signal and the frequency of the average CO signal; and
    d) selecting a tuning curve for the CO based on comparing the frequency of the average reference signal and the frequency of the average CO signal to effect coarse tuning of the CO.

17. The method of claim 16 wherein the CO comprises a circuit having a selectable capacitance with a plurality of settings corresponding to a plurality of tuning curves and the method further comprising iteratively selecting the plurality of tuning curves until the frequency of the average CO signal is within a desired proximity of the frequency of the average reference signal.

18. The method of claim 16 wherein the CO comprises a circuit having a plurality of selectable elements with a plurality of settings corresponding to a plurality of tuning curves and the method further comprising iteratively selecting the plurality of tuning curves until the frequency of the average CO signal is within a desired proximity of the frequency of the average reference signal.

19. The method of claim 17 further comprising generating a selection signal used to directly select one of the settings of the selectable capacitance.

20. The method of claim 19 wherein the selection signal comprises a plurality of signals configured to switch capacitors into the circuit.

21. The method of claim 20 further comprising coupling a fixed initialization signal to a fine tuning signal for the CO to override feedback from a phase detector of the PLL during coarse tuning and bias the CO to operate at a predefined control setting.

22. The method of claim 16 wherein the CO has a circuit having a selectable capacitance with a plurality of settings corresponding to a plurality of tuning curves and the method further comprising providing a CO control signal to iteratively decrement the selectable capacitance to select another of the plurality of tuning curves when the average CO signal has a frequency less than that of the average reference signal.

23. The method of claim 22 further comprising initializing the circuit of the CO to one of the tuning curves associated with the lowest acceptable operating frequency range.

24. The method of claim 16 wherein the CO has a circuit having a selectable capacitance with a plurality of settings corresponding to a plurality of tuning curves and the method further comprising providing a CO control signal to iteratively increment the selectable capacitance to select another of the plurality of tuning curves when the average CO signal has a frequency greater than that of the average reference signal.

25. The method of claim 24 further comprising initializing the circuit of the CO to one of the tuning curves associated with a highest acceptable operating frequency range.

26. A system for coarse tuning a fractional-N synthesizer comprising:
  a) means for dividing a divided reference signal derived from the reference frequency of a phase lock loop (PLL) by a factor M to provide an average reference signal;
  b) means for dividing a divided controlled oscillator (CO) signal by the factor M to provide an average CO signal wherein the divided reference signal and the divided CO signal are approximately equal when a CO is operating at a desired frequency and the divided CO signal is derived from fractional-N division of the output of the CO for the PLL;
  c) means for comparing a frequency of the average reference signal and the frequency of the average CO signal; and
  d) means for selecting a tuning curve for the CO based on comparing the frequency of the average reference signal and the frequency of the average CO signal to effect coarse tuning of the CO.

27. The system of claim 26 wherein the CO comprises a circuit having a selectable capacitance with a plurality of settings corresponding to a plurality of tuning curves and further comprising means for iteratively selecting the plurality of tuning curves until the frequency of the average CO signal is within a desired proximity of the frequency of the average reference signal based on the CO control signal.

28. The system of claim 27 further comprising means for generating a selection signal used to directly select one of the settings of the selectable capacitance.

29. The system of claim 28 wherein the selection signal comprises a plurality of signals configured to switch capacitors into the circuit.

30. The system of claim 29 further comprising means for coupling a fixed initialization signal to a fine tuning signal of the CO to override feedback from a phase detector of the PLL during coarse tuning and bias the CO to operate at a predefined control setting.

31. The system of claim 26 wherein the CO has a circuit having a selectable capacitance with a plurality of settings corresponding to a plurality of tuning curves and further comprising means for providing a CO control signal to iteratively decrement the selectable capacitance to select another of the plurality of tuning curves when the average CO signal has a frequency less than that of the average reference signal.

32. The system of claim 31 further comprising means for initializing the circuit of the CO to one of the tuning curves associated with a lowest acceptable operating frequency range.

33. The system of claim 26 wherein the CO has a circuit having a selectable capacitance with a plurality of settings corresponding to a plurality of tuning curves and further comprising means for providing the CO coarse tuning signal to iteratively increment the selectable capacitance to select another of the plurality of tuning curves when the average CO signal has a frequency greater than that of the average reference signal.

34. The system of claim 33 further comprising means for initializing the circuit of the CO to one of the tuning curves associated with a highest acceptable operating frequency range.

35. A circuit comprising:
  a) a controlled oscillator (CO) adapted to provide a CO output signal in response to a CO control signal, the CO including a circuit having a plurality of selectable capacitance values corresponding to selectable tuning curves;
  b) a fractional-N divider adapted to divide the CO output signal to produce a divided CO signal;
  c) a phase detector adapted to receive a divided reference frequency and the divided CO signal to produce a phase difference signal, which is filtered to provide the CO control signal;
  d) a first divider adapted to further divide the divided reference signal by a factor M to provide an average reference signal;
  e) a second divider adapted to further divide the divided CO signal by the factor M to provide an average CO signal; and
  f) tuning logic adapted to compare a frequency of the average reference signal and the frequency of the average CO signal and provide the CO control signal to select the tuning curve of the CO based thereon to effect coarse tuning of the CO.

36. The circuit of claim 35 further comprising a coarse tune counter adapted to receive the CO control signal and generate a select signal to provide to the circuit of the CO to select one of the selectable capacitance values to select one of the tuning curves.

37. The circuit of claim 36 wherein the CO and the coarse tune counter are implemented in one of the group consisting of an integrated circuit and a semiconductor die.

38. The circuit of claim 36 wherein the CO control signal is a pulse configured to effect either incrementing or decrementing the selected one of the selectable capacitance values.

39. The circuit of claim 33 further comprising. a switch for coupling a fixed initialization signal to the phase difference signal or a derivative thereof to bias the CO control signal to the fixed initialization signal such that the CO operates at a predefined control setting during coarse tuning.

40. A circuit for coarse tuning a fractional-N synthesizer comprising:

a) a first divider adapted to further divide a divided reference signal derived from the reference frequency of a phase lock loop (PLL) by a factor M to provide an average reference signal;

b) a second divider adapted to further divide a divided controlled oscillator (CO) signal by the factor M to provide an average CO signal wherein the divided reference signal and the divided CO signal are approximately equal when a CO is operating at a desired frequency and the divided CO signal is derived from fractional-N division of the output of the CO for the PLL; and c) logic adapted to compare a frequency of the average reference signal and the frequency of the average CO signal.

* * * * *